(12) United States Patent  
Harris

(10) Patent No.: US 6,239,622 B1
(45) Date of Patent: May 29, 2001

(54) SELF-TIMED DOMINO CIRCUIT

(75) Inventor: David Harris, Claremont, CA (US)

(73) Assignee: Sun Microsystems, Inc.

( * ) Notice: Subject to any disclaimer, the term of this patent is extended or adjusted under 35 U.S.C. 154(b) by 0 days.

(21) Appl. No.: 09/305,904

(22) Filed: May 5, 1999

(51) Int. Cl.[7] .................................................. H03K 19/096
(52) U.S. Cl. ............................................. 326/98; 326/121
(58) Field of Search ....................... 326/98, 121; 327/200

(56) References Cited

U.S. PATENT DOCUMENTS 5,541,537 * 7/1996 Kim et al. ............................. 326/121
5,828,234 * 10/1998 Spargue ................................. 326/98
5,973,529 * 10/1999 Chappell et al. ..................... 327/200

* cited by examiner

Primary Examiner—David Nelms
Assistant Examiner—Thong Le
(74) Attorney, Agent, or Firm—Townsend and Townsend and Crew LLP

(57) ABSTRACT

A self-timed domino control circuit for control of a data path is described which provides zero overhead latency and improved cycle time, while maintaining the delay insensitive characteristics of self-timed domino circuits. The data path includes sequential stages i−1, i and i+1, each of which performs a logic function on input signals supplied to it. Each stage requires a first time period for precharging and a second time period for evaluating. The logic function of stage i is evaluated when stage i+1 is precharging, and stage i is precharged when stage i+1 has completed evaluating, but before stage i+1 begins precharging, and when stage i−1 has completed precharging.

9 Claims, 5 Drawing Sheets

SELF-TIMED DOMINO CIRCUIT

BACKGROUND OF THE INVENTION

This invention relates to asynchronous circuits, and in particular to an improved asynchronous circuit having zero overhead in forward latency.

Advances in semiconductor fabrication technology continually allow increasing numbers of logic gates to be placed on a single integrated circuit and permit operation of such circuits at speeds greater than prior generations of circuits. Two known methodologies for the design of such circuits are synchronous and asynchronous. Synchronous designs provide a global clock signal which causes all of the circuitry on the integrated circuit chip to operate in lockstep. Asynchronous designs use local control to determine when local gates operate, and the local gates do not necessarily operate in synchrony with the rest of the integrated circuit chip. As such, asynchronous designs eliminate the difficulty of distributing a clock "globally" across the integrated circuit, and also potentially offer improved speed, lower power consumption, and other benefits.

Asynchronous circuits can be broadly characterized as self-timed and timed. Self-timed asynchronous circuits, often referred to as delay insensitive circuits, use a "hand shake" between data and control circuits to assure that the control does not request operations until the appropriate data is available. Timed circuits attempt to match the delays of the control and data circuits so that the control circuit does not activate until the data is ready. As a result, self-timed circuits are more robust because they do not depend upon accurate matching of delays, a difficult phenomenon over the wide range of performance resulting from tolerances in integrated circuit manufacturing processes. In self-timed circuits, the data signals indicate not only the value of the data, but also its validity. This enables the control system to assure data validity before processing the data. One technique for achieving this is to encode a data bit using two signals, referred to as dual rail signaling. If both signals are low, the data is invalid. If the first signal is high and the second low, the data can be considered high, while if the second is high and the first low, the data can be considered low. A condition of both signals being high is not permitted.

Prior self-timed domino circuits are generally discussed and disclosed in a commonly assigned copending patent application "Apparatus and Methods for High Throughput Self-Timed Domino Circuits," Ser. No. 09/305,904, filed May 5, 1999 by David Harris and William Coates.

SUMMARY OF THE INVENTION

This invention provides a new domino control circuit which provides delay insensitive characteristics of self-timed circuits. In addition, it provides improved cycle time and zero overhead latency. In a preferred embodiment of the invention, a method of controlling a data path having a plurality of stages is provided. The data path includes sequential stages i−1, i and i+1, each of which performs a logic function on input signals supplied to it, and each stage requires a first time period for precharging and a second time for evaluating. The method includes the steps of evaluating the logic function of the stage i when stage i+1 is precharging, and precharging stage i when stage i+1 has completed evaluating, but before stage i+1 begins precharging, and when stage i−1 has completed precharging.

Furthermore, in a preferred embodiment, the circuit for use in the self-timed system having a sequence of stages i, i−1 and i+1 in which request and done signals are exchanged between a control path and a data path includes a series of four sequentially connected transistors connected between a first source of high potential and a second source of low potential, with the first transistor connected to the high potential and the fourth transistor connected to the low potential. An output signal is taken from between the third and the fourth transistor. In such a circuit, the first, second and third transistors are controlled by a request signal for the i+1 stage, a done signal from the i−1 stage, and a done signal from the i+1 stage. The fourth transistor is controlled by a request signal for the i+1 stage.

BRIEF DESCRIPTION OF THE DRAWINGS

FIG. 3 is a dependency graph for the circuit of FIG. 2a;

DESCRIPTION OF THE SPECIFIC EMBODIMENTS

Figure 1:
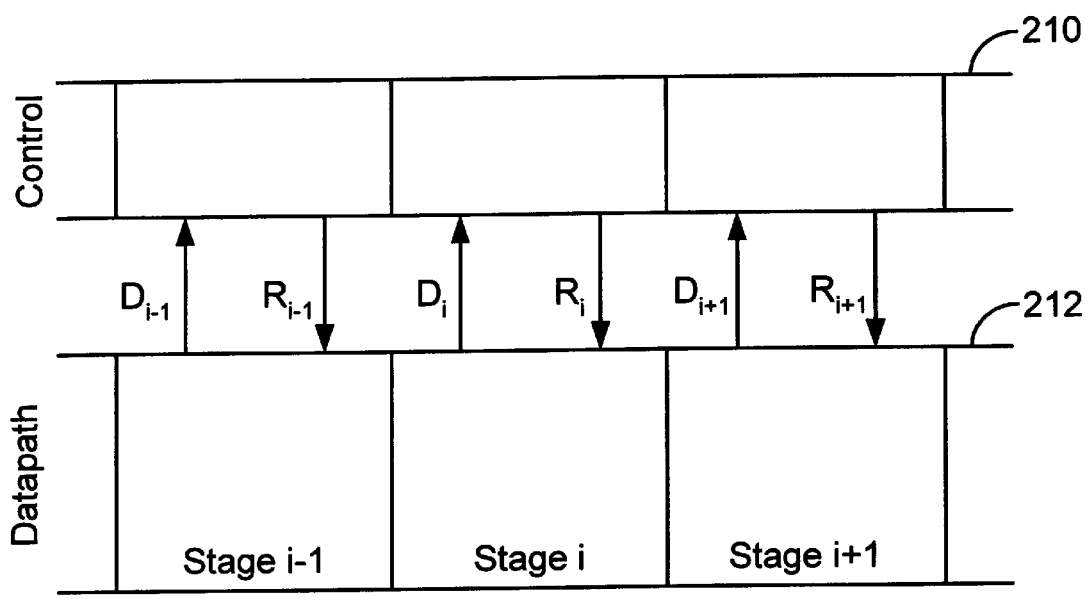
FIG. 1 is a block diagram of the control path and data path in a self-timed circuit.

FIG. 1 is a block diagram of a self-timed domino system showing the interaction of a control path 210 and a data path 212. As shown, the data path includes multiple stages (i−1, i, i+1, etc.). Within each stage the domino gates share the same request (R) signal. The done (D) signal is supplied from a stage when all of the gates in that stage have completed performing their designed logic operations (which time will usually be different for each stage). The control path uses the done signals to generate additional request signals for continued processing of the information through the data path.

FIG. 2 illustrates three prior art control circuits for a self-timed domino system such as depicted in FIG. 1. The input and output signals in each of the circuits of FIG. 2 are labeled correspondingly with the diagram of FIG. 1.

Figure 2A:
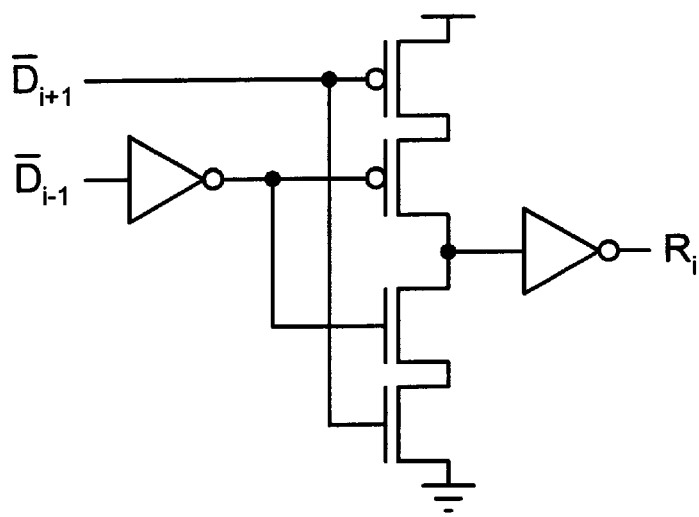
FIGS. 2a, 2b and 2c are prior art domino control circuits.

The circuit shown in FIG. 2a operates according to the following timing rules:

(1) It performs evaluations when the next stage is done precharging and the previous stage is done evaluating; and (2) it performs precharging when the next stage is done evaluating and the previous stage is done precharging.

There are many possible timing rules. Good timing rules provide high throughput and low latency. Dependency graphs (discussed below) can be used to compute the throughput and latency of a timing rule.

Figure 3:
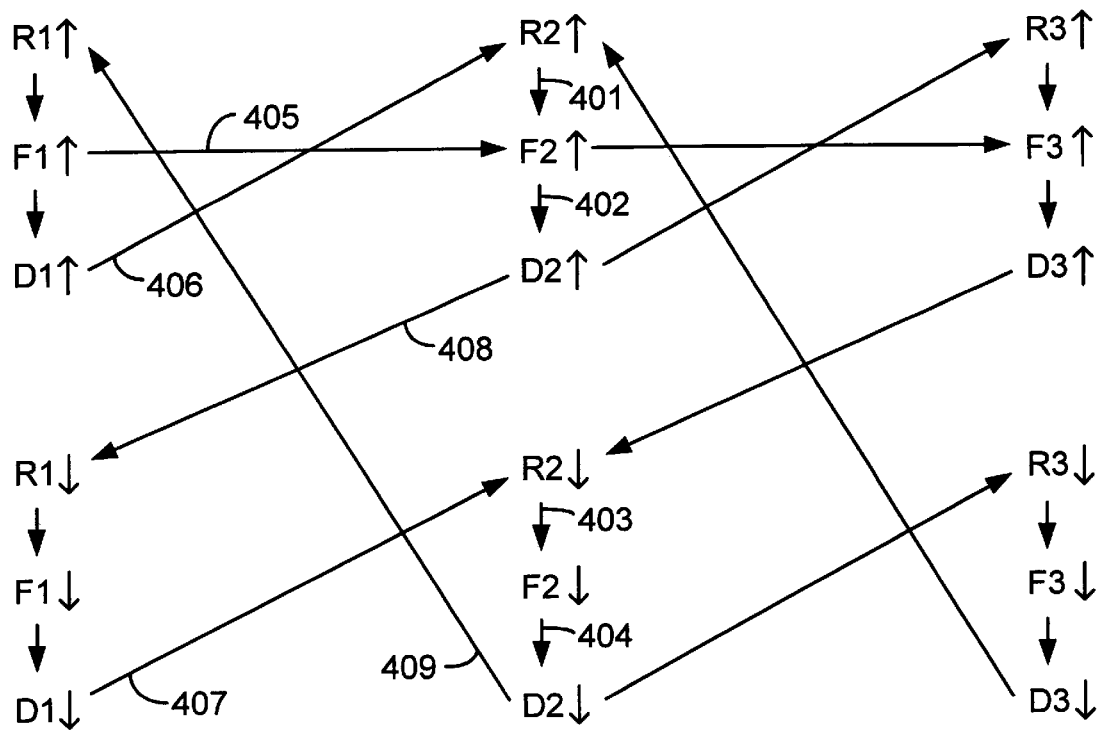

The operation of the circuit shown in FIG. 2a can be understood using the dependency graph shown in FIG. 3. The nodes of the graph represent the delays of particular transitions, where R is the delay of the element computing a request, F is the delay of a stage or functional logic in the data path, and D is the delay of detection of the completion of the action. The up arrow or down arrow following the letter indicates that the letter refers specifically to the delay of the rising or falling transition. The rising delay of F is known as the evaluation time or delay, and the falling delay of F is known as the precharge time or delay. The implementation can make the evaluation time different from the precharge time.

In FIG. 3, edge 401 indicates that a stage 2 (the central column) must have a high request (R2↑) before it can evaluate (F2↑). Edge 402 indicates that the stage must complete evaluation (F2↑) before it can signal done (D2↑). Edge 403 indicates that the stage must have a low request before it can precharge, while edge 404 indicates that a stage must complete precharge before it can release the done signal. Edge 405 indicates that a stage must complete evaluation before the next stage can complete evaluation. Edge 406 indicates that a stage must signal done before the next stage can request evaluation, while edge 407 indicates that a stage must release its done signal before the next stage can request precharge. Edge 408 indicates that a stage must signal done before the previous stage can request precharge. Edge 409 indicates that a stage must release its done signal before the previous stage can request evaluation. In general, edges 401 through 405 are inherent to the nature of the stage of FIG. 2a, while edges 406–409 are enforced by the control circuit of FIG. 2a.

The latency of a stage is the delay from when a stage finishes evaluating until the next stage finishes evaluating. This is found by tracing the longest path of arrows between F1↑ and F2↑. If all stages are identical, the latency of a stage controlled by the circuit of FIG. 2a will be the sum of the evaluation time E plus the delay of the request R, plus the delay of the completion detection D. The delay of the useful computation is only E, and thus the extra delay caused by R+D is considered overhead and is undesirable. The cycle time of a stage is the delay of the longest simple cycle passing through the stage.

Figure 2B:
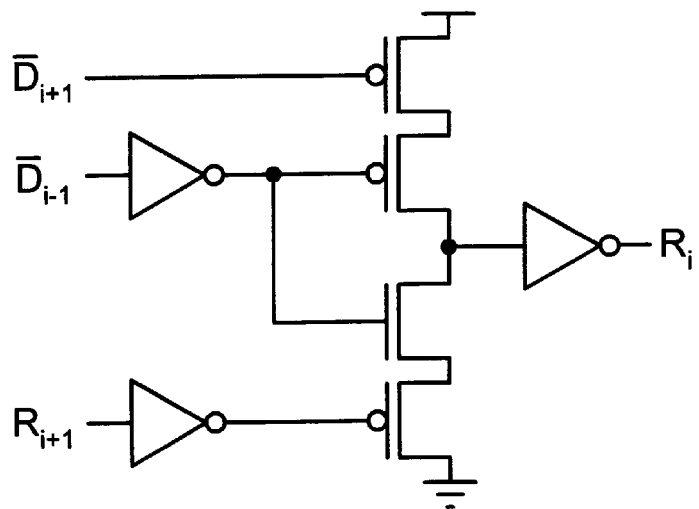

FIG. 2b illustrates another prior art domino control circuit. This one carries out the control rule:

(1) Evaluate when the next stage is in precharge and the previous stage is done evaluating; and (2) precharge when the next stage is done evaluating and the previous stage is done precharging.

A similar dependency graph to that shown for FIG. 2b can be prepared.

Figure 2C:
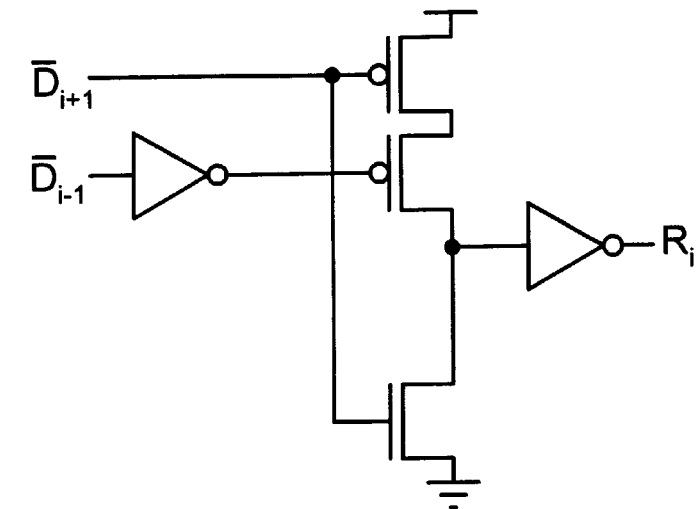

FIG. 2c is another prior art domino control circuit which embodies the control rule:

(1) Evaluate when the next stage is done precharging; and (2) precharge when the next stage is done evaluating and the previous stage is done precharging.

Each of these three different prior art circuits suffers from various disadvantages. A goal of this invention is to provide a domino control circuit which provides zero overhead latency and improved cycle time, while maintaining the delay insensitive characteristics of self-timed domino circuits. To implement this circuit the control rule is:

(1) Evaluate when the next stage is precharging; and (2) Precharge when the next stage is done evaluating and still in evaluation, and the previous stage is done precharging.

Figure 4:
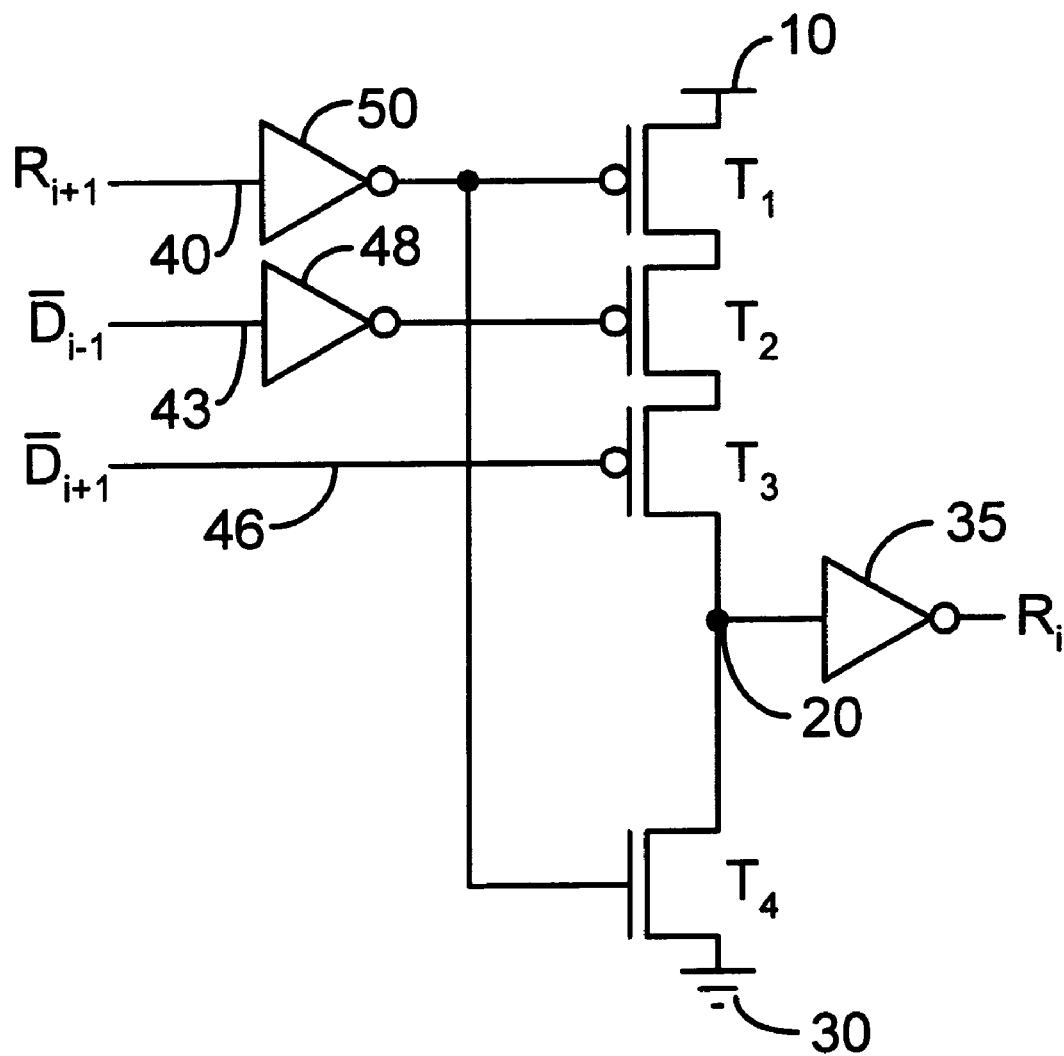
FIG. 4 is a circuit schematic of a preferred embodiment of the invention.

FIG. 4 is a circuit schematic of a domino control circuit according to a preferred embodiment of this invention. As shown, the circuit includes three serially connected pmos transistors, T1, T2 and T3 connected between an upper potential source 10 and an output node 20. An nmos transistor T4 is connected between a low potential source 30 and output node 20. An inverter 35 coupled to output node 20 provides the request signal for the stage being controlled by the circuit. The request signal $R_{i+1}$ from the subsequent stage i+1 is provided at node 40, while the active low done signals from the preceding stage i−1 and from the subsequent stage i+1 are provided to nodes 43 and 46, respectively. The complementary done signal supplied to node 43 is inverted by inverter 48 to drive transistor T2. The request signal supplied to node 40 is inverted by inverter 50 and used to control transistor T1. The circuit shown in FIG. 4 achieves zero overhead in forward latency because the control signal does not wait for a previous stage to complete.

In FIG. 4 when node 40 is low, it turns on the pulldown transistor T4, pulling node 20 toward ground and output $R_i$ goes high. This signal is used to start the action of evaluation in the gates coupled to receive this signal in stage i. Output signal $R_i$ goes low when all three transistors T1, T2 and T3 are turned on to pull node 20 toward the source of high potential 10.

Figure 5:
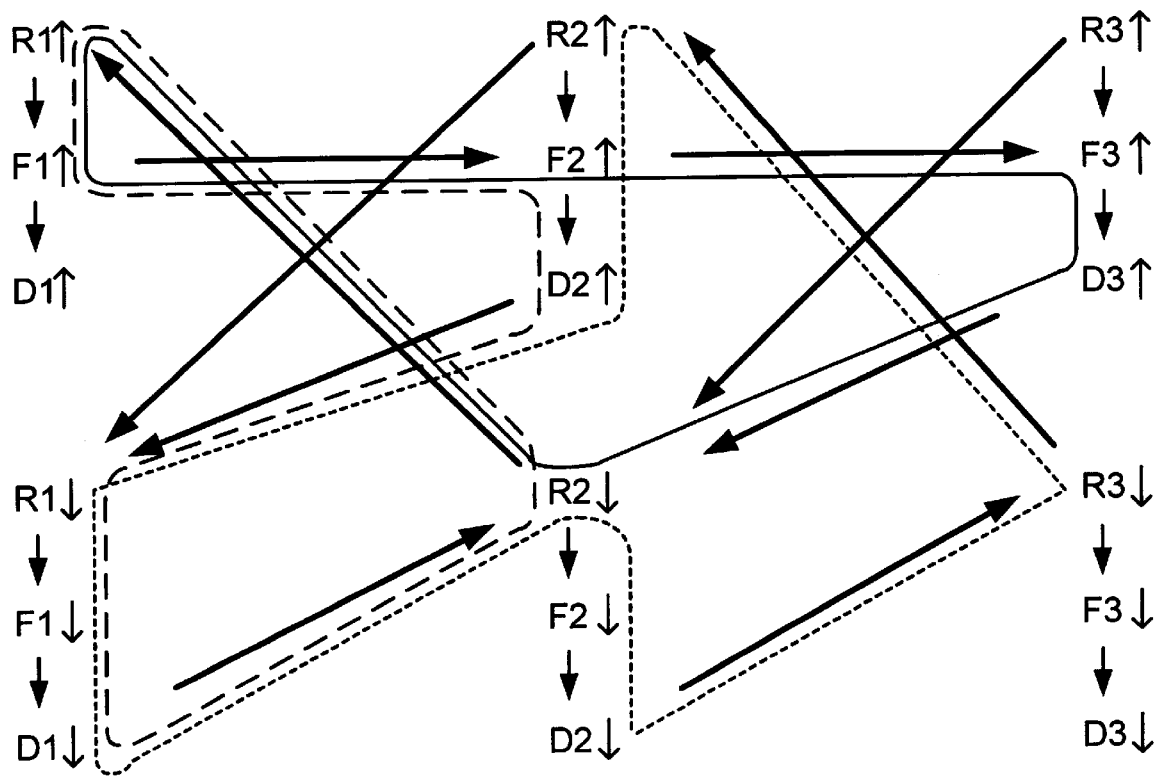
FIG. 5 is a dependency graph for the circuit of FIG. 4.

FIG. 5 is a dependency graph in the same format as FIG. 3. In FIG. 5 the arrows with darkened heads represent constraints on the operation of the stages, as described in FIG. 3. For example, the arrow from D1 to R2 means that he first stage must release its Done signal before the second stage can request precharge. As with FIG. 3 R is the delay of the generalized C element computing a request, F is the delay of a stage or functional block in the data path, and D is the delay of a completion detection. Rising delays of F are evaluation time, and falling delays of F are precharge time.

Three different execution paths are illustrated using a solid line, a dashed line and a dotted line. These paths represent three possible limits to throughput. The total delay T for each of the three paths is shown at the bottom of FIG. 5. As a result, it can be shown that the cycle time is thus set by the maximum of the three cycle limiting paths:

$$T=1F+2R+1D+2\text{MAX}[F,P+R+D]$$

This represents a savings of 1P+1D in comparison to the prior art circuit illustrated in FIG. 2c. The circuit of FIG. 3 also has the advantage of providing zero overhead in forward latency, which the circuit illustrated in FIG. 2b does not.

The preceding has been a description of the preferred embodiment of the invention. It will be appreciated that deviations and modifications can be made without departing from the scope of the invention, which is defined by the appended claims.

What is claimed is:

1. A self-timed domino system comprising:

a control path having a sequence of stages i−1, i and i+1, each stage of the control path being provided with a done signal at a done terminal of that stage and providing a request signal at a request terminal of that stage;

a data path having a sequence of stages i−1, i and i+1, each stage of the data path being provided with the request signal at a request terminal of that stage and providing the done signal at a done terminal of that stage;

the control path stage i−1 being coupled to the data path stage i−1;

the control path stage i being coupled to the data path stage i;

the control path stage i+1 being coupled to the data path stage i+1; and wherein the control path and the data path stages are coupled together by circuits, each circuit having a first, a second, and a third input terminal and one output terminal, the output terminal being coupled to the request terminal of data path stage i, the first input terminal being coupled to the request terminal of a control path stage i+1, the second input terminal being coupled to the done terminal of a data path stage i−1, the third input terminal being coupled to the done terminal of a data path stage i+1;

a first transistor coupled to the first input terminal;

a second transistor coupled to the second input terminal;

a third transistor coupled to the third input terminal;

a fourth transistor coupled to the output terminal and to the request terminal of the control path stage0 i+1; and wherein the first, second and third transistors are serially connected between a first source of potential and the output terminal, and the fourth transistor is connected between a second source of potential and the output terminal.

2. The circuit as in claim 1 wherein each of the first, second and third transistors comprises a field effect transistor of first conductivity type, and the fourth transistor comprises a field effect transistor of opposite conductivity type.

3. The circuit as in claim 2 wherein the first conductivity type is pmos and the opposite type is nmos.

4. The circuit as in claim 3 wherein a first inverter is connected to the output terminal to receive a signal therefrom.

5. The circuit as in claim 3 wherein the request and done terminals are coupled to the gates of the nmos and pmos transistors.

6. The circuit as in claim 5 wherein the second source of potential is ground and the first source of potential is more positive than ground.

7. The circuit as in claim 4 wherein:

a second inverter is connected to the request terminal of control path stage i+1 and to the first transistor; and a third inverter is connected to the done terminal of the data path stage i−1 and to the second transistor.

8. A method of controlling a data path having a plurality of stages including sequential stages i−1, i and i+1, each stage for performing a logic function on input signals supplied thereto, and each stage requiring a first time period for precharging and a second subsequent time for evaluating, the method comprising:

evaluating the logic function of stage i when stage i+1 is precharging;

precharging stage i when stage i+1 has completed evaluating, but before stage i+1 begins precharging, and when stage i−1 has completed precharging.

9. The method as in claim 8 wherein the method is carried out using an electronic circuit coupled to each of stages i−1, i and i+1.

* * * * *